United States Patent
Griseta et al.

(10) Patent No.: US 7,996,748 B2
(45) Date of Patent: *Aug. 9, 2011

(54) ECC FOR SINGLE 4-BITS SYMBOL CORRECTION OF 32 SYMBOLS WORDS WITH 22 MAXIMUM ROW WEIGHT MATRIX

(75) Inventors: Antonio Griseta, Mola Di Bari (IT); Angelo Mazzone, Ruvo Di Puglia (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 1482 days.

This patent is subject to a terminal disclaimer.

(21) Appl. No.: 11/437,270

(22) Filed: May 19, 2006

(65) Prior Publication Data

US 2007/0011601 A1    Jan. 11, 2007

(30) Foreign Application Priority Data

May 19, 2005  (EP) .................................... 05104238
May 19, 2005  (EP) .................................... 05104239

(51) Int. Cl.
  *H03M 13/00*     (2006.01)
(52) U.S. Cl. ..................................................... 714/785
(58) Field of Classification Search ................... 714/785
  See application file for complete search history.

(56) References Cited

U.S. PATENT DOCUMENTS

| | | | | |
|---|---|---|---|---|
| 4,736,376 | A | * | 4/1988 | Stiffler .......................... 714/785 |
| 5,056,089 | A | | 10/1991 | Furuta et al. |
| 5,450,423 | A | * | 9/1995 | Iwasaki et al. ................ 714/767 |
| 5,537,427 | A | | 7/1996 | Chen et al. |
| 6,219,817 | B1 | | 4/2001 | Holman |
| 6,233,717 | B1 | | 5/2001 | Choi |
| 2003/0070135 | A1 | * | 4/2003 | Murillo ......................... 714/785 |
| 2004/0054959 | A1 | | 3/2004 | Blankenship et al. |

OTHER PUBLICATIONS

D. Rossi, et al., "Fast and Compact Error Correcting Scheme for Reliable Multilevel Flash Memories", Proceedings of the 2002 IEEE International Workshop on Memory Technology, Design and Testing (MTDT 2002).

C.L. Chen, "Symbol Error-Correcting Codes for Computer Memory Systems", IEEE Transactions on Computers, vol. 41, No. 2, Feb. 1992.

Lin, Costello, "Error Control Coding" 2004, Pearson Prentice Hall, USA, pp. 920-921.

* cited by examiner

*Primary Examiner* — Scott T Baderman
*Assistant Examiner* — Enam Ahmed
(74) *Attorney, Agent, or Firm* — Lisa K. Jorgenson; Kevin D. Jablonski; Graybeal Jackson, LLP (57) ABSTRACT

An error correction device is provided. Such error correction device may make use of an error-correction code defined by a parity matrix specialized for the application to multilevel memories. For example, the parity matrix is characterized by having a Maximum Row Weight equal to 22.

30 Claims, 7 Drawing Sheets

FIG.1

$$T^\infty = \begin{bmatrix} 0 & 0 & 0 & 0 \\ 0 & 0 & 0 & 0 \\ 0 & 0 & 0 & 0 \\ 0 & 0 & 0 & 0 \end{bmatrix} = 0 \quad T^0 = \begin{bmatrix} 1 & 0 & 0 & 0 \\ 0 & 1 & 0 & 0 \\ 0 & 0 & 1 & 0 \\ 0 & 0 & 0 & 1 \end{bmatrix} = I \quad T^1 = \begin{bmatrix} 0 & 0 & 0 & 1 \\ 1 & 0 & 0 & 1 \\ 0 & 1 & 0 & 0 \\ 0 & 0 & 1 & 0 \end{bmatrix}$$

$$T^2 = \begin{bmatrix} 0 & 0 & 1 & 0 \\ 0 & 0 & 1 & 1 \\ 1 & 0 & 0 & 1 \\ 0 & 1 & 0 & 0 \end{bmatrix} \quad T^3 = \begin{bmatrix} 0 & 1 & 0 & 0 \\ 0 & 1 & 1 & 0 \\ 0 & 0 & 1 & 1 \\ 1 & 0 & 0 & 1 \end{bmatrix} \quad T^4 = \begin{bmatrix} 1 & 0 & 0 & 1 \\ 1 & 1 & 0 & 1 \\ 0 & 1 & 1 & 0 \\ 0 & 0 & 1 & 1 \end{bmatrix}$$

$$T^5 = \begin{bmatrix} 0 & 0 & 1 & 1 \\ 1 & 0 & 1 & 0 \\ 1 & 1 & 0 & 1 \\ 0 & 1 & 1 & 0 \end{bmatrix} \quad T^6 = \begin{bmatrix} 0 & 0 & 1 & 1 \\ 0 & 1 & 0 & 1 \\ 1 & 0 & 1 & 0 \\ 1 & 1 & 0 & 1 \end{bmatrix} \quad T^7 = \begin{bmatrix} 1 & 1 & 0 & 1 \\ 1 & 0 & 1 & 1 \\ 0 & 1 & 0 & 1 \\ 1 & 0 & 1 & 0 \end{bmatrix}$$

$$T^8 = \begin{bmatrix} 1 & 0 & 1 & 0 \\ 0 & 1 & 1 & 1 \\ 1 & 0 & 1 & 1 \\ 0 & 1 & 0 & 1 \end{bmatrix} \quad T^9 = \begin{bmatrix} 0 & 1 & 0 & 1 \\ 1 & 1 & 1 & 1 \\ 0 & 1 & 1 & 1 \\ 1 & 0 & 1 & 1 \end{bmatrix} \quad T^{10} = \begin{bmatrix} 1 & 0 & 1 & 1 \\ 1 & 1 & 1 & 0 \\ 1 & 1 & 1 & 1 \\ 0 & 1 & 1 & 1 \end{bmatrix}$$

$$T^{11} = \begin{bmatrix} 0 & 1 & 1 & 1 \\ 1 & 1 & 0 & 0 \\ 1 & 1 & 1 & 0 \\ 1 & 1 & 1 & 1 \end{bmatrix} \quad T^{12} = \begin{bmatrix} 1 & 1 & 1 & 1 \\ 1 & 0 & 0 & 0 \\ 1 & 1 & 0 & 0 \\ 1 & 1 & 1 & 0 \end{bmatrix} \quad T^{13} = \begin{bmatrix} 1 & 1 & 1 & 0 \\ 0 & 0 & 0 & 1 \\ 1 & 0 & 0 & 0 \\ 1 & 1 & 0 & 0 \end{bmatrix}$$

$$T^{14} = \begin{bmatrix} 1 & 1 & 0 & 0 \\ 0 & 0 & 1 & 0 \\ 0 & 0 & 0 & 1 \\ 1 & 0 & 0 & 0 \end{bmatrix}$$

FIG.2

$$H = \begin{bmatrix} I & T^2 & I & T^3 & I & 0 & 0 & 0 & 0 & I & I & T^2 & I & 0 & 0 & 0 & I & T^{14} \\ 0 & 0 & 0 & 0 & 0 & 0 & 0 & 0 & I & I & T^2 & I & 0 & 0 & 0 & 0 & 0 & 0 \\ 0 & 0 & 0 & 0 & 0 & I & T^2 & I & I & 0 & 0 & 0 & 0 & T^{14} & T^3 & T & I & I \\ I & I & T^2 & I & T & I & I & T^2 & 0 & 0 & 0 & T^{14} & I & I & I & 0 & 0 \\ I & T^2 & I & I & I & 0 & 0 & 0 & 0 & 0 & 0 & 0 & 0 & 0 & I & 0 & 0 & 0 \\ 0 & 0 & 0 & T^{14} & T & I & T^{14} & I & T^2 & T & I & T^2 & T^{14} & I & 0 & I & 0 & 0 \\ T^{14} & I & T^2 & 0 & 0 & 0 & 0 & 0 & 0 & T^2 & I & I & T^{14} & 0 & 0 & I & 0 \\ 0 & 0 & 0 & 0 & 0 & I & I & T^2 & I & I & 0 & 0 & 0 & 0 & 0 & 0 & 0 & I \end{bmatrix}$$

ECC FOR SINGLE 4-BITS SYMBOL CORRECTION OF 32 SYMBOLS WORDS WITH 22 MAXIMUM ROW WEIGHT MATRIX

PRIORITY CLAIM

This application claims priority from European patent application Nos. EP05104239.8, filed May 19, 2005, and EP05104238.0, filed May 19, 2005, which are incorporated herein by reference.

CROSS REFERENCE TO RELATED APPLICATIONS

This application is related to U.S. patent application Ser. No. 11/437,273 entitled ECC FOR SINGLE 4-BITS SYMBOL CORRECTION OF 32 SYMBOLS WORDS WITH 21 MAXIMUM ROW WEIGHT MATRIX, which has a common filing date and owner and which are incorporated by reference.

TECHNICAL FIELD

An embodiment of the present invention relates to the Error Correction Code (ECC) field.

BACKGROUND

ECC technologies are commonly used in a number of applications, such as in magnetic discs, magnetic tapes, optical discs and semiconductor memories. Any ECC is aimed at detecting and possibly correcting errors in data of interest.

Considering in particular the memories, when an ECC is used, redundancy bits (also called check bits) are added to the bits of each data word, creating a code word that will be stored in the memory. For each element in the set of all possible configurations of data bits, one and only one possible configuration of redundancy bits exists. This is accomplished by means of a corresponding parity matrix that entirely defines the ECC itself. When a read operation occurs, the system recalculates the redundancy bits from the read data bits and compares the new redundancy bits with the ones read from the memory; any difference is indicative of errors in the read data bits, and can be used to correct them in some cases.

Using more or less redundancy bits makes the difference between detection and correction capability. For example, using only a single redundancy bit allows detecting a single bit error only, performing the so called "parity check".

Another classical example is the Hamming code: given k data bits, (n-k) redundancy bits are needed to obtain a code with n-bit code words able to correct a single-bit error, under the condition that $2^{(n-k)} \geq n+1$. For example, this single-bit-error capability satisfies the reliability needs of bit-oriented, bit-interleaved memories.

However, there are applications wherein tolerance for multiple errors is needed. Typical examples are multilevel flash memories that store multiple bits in the same cell; in this case, when the cell fails due to an alpha particle, it is possible that multiple bits must be corrected; other examples are bit-oriented bit-interleaved memories, wherein it would be desirable to correct "hard" multi-bit errors to increase production yield.

This higher error-correction capability of the ECC translates into an increased complexity of the parity matrix (and then of its circuital implementation). Unfortunately, no algorithm is available for designing the parity matrix automatically so as to fit specific requirements. On the contrary, the operation must be performed manually with an iterative process that attempts to optimize the parity matrix for the desired goal. However, this process is very difficult, since any update to the parity matrix (in order to approach the goal locally) can have unexpected side-effects that adversely affect the characteristics of the parity matrix on the whole. Therefore, the process of designing the parity matrix is very time consuming, and often does not allow obtaining a parity matrix that actually fits the desired requirements.

Some attempts to design parity matrixes optimized for specific applications are known in the art. For example, U.S. Pat. No. 6,219,817, which is incorporated by reference, illustrates an error-correcting and -detecting circuit applicable to solve the problem of detecting a wire fault on a bus with time-multiplexed data. Such an error-correcting and -detecting circuit makes use of a code defined by a parity matrix whose Maximum Row Weight (defined by the maximum number of "1"s on every row) is equal to 27.

SUMMARY

A proposed embodiment of the invention is a specific parity matrix for an error correction code.

Particularly, an embodiment of the present invention provides an error-correction device. The error-correction device includes means (such as an EXOR tree circuit) for generating a check word of 16 bits from an (input and/or output) data word of 128 bits according to a parity matrix of 16×144 bits; the check word is capable of providing information about a correctness of the data word. Said parity matrix consists of any permutation of the 144 vectors of 16 bits shown in FIG. 3b.

In one example, the proposed parity matrix has been specifically optimized for providing a low Maximum Row Weight (that is, 22).

In this way, the circuital implementation of the parity matrix is simple and effective.

Particularly, the process of generating the check word is accomplished without using logic gates that add too-long delays.

Without detracting from its general applicability, the proposed solution may be particularly advantageous in multi-level flash memories.

Typically, the error-correction device uses the same parity matrix both for an input operation and for an output operation.

Figure 3A:
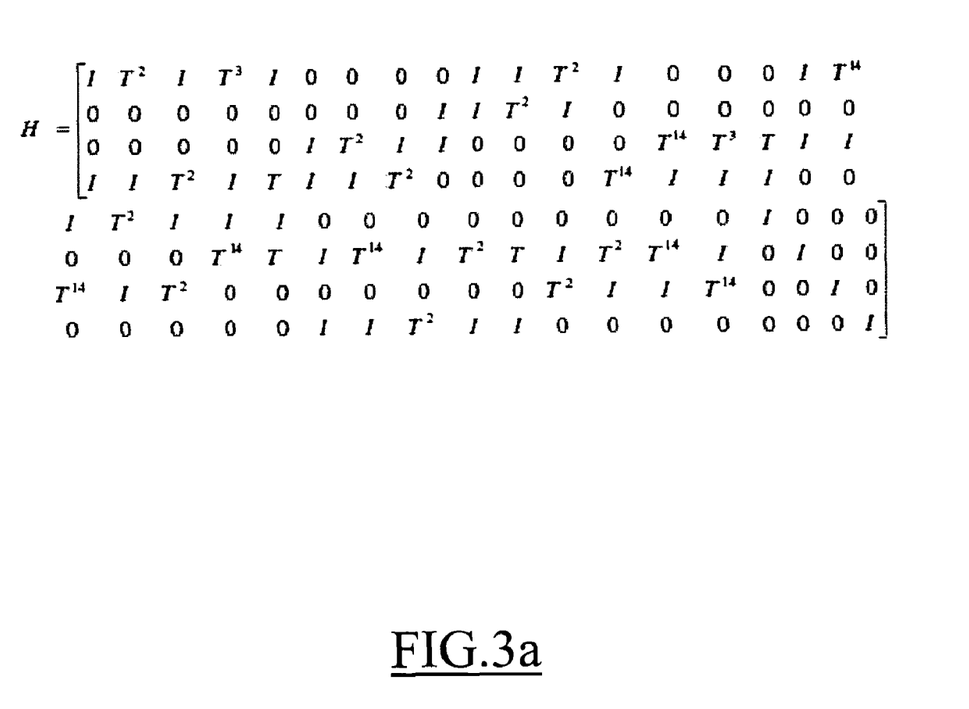
FIG. 3a illustrates a parity matrix according to an embodiment of the invention represented in $GF(2^4)$.

In another example, each data word, check word and code word is formed by symbols in $GF(2^4)$ of 4 bits; the parity matrix consists of 4×36 symbols defined by any permutation of the 36 vectors of 4 symbols shown in FIG. 3a.

This choice ensures that any single-symbol error can always be corrected. Moreover, it allows obtaining a simple circuital implementation.

Advantageously, each code word has the symbols (of the included check word in positions within the code word corresponding to the vectors of the parity matrix) composed by three all-zeros matrices and one identity matrix.

In this way, the code is in a systematic form.

In another example, the parity matrix is the one shown in FIG. 3a.

In one example, the proposed matrix optimizes the distribution of the "1"s, so as to balance the propagation delay.

In another embodiment of the invention, a single combinatorial network is used for both the input operations and the output operations.

This implementation allows avoiding an excessive waste of silicon area for integrating the error correction device (even if it introduces a delay caused by the element required to select the data to be passed to the combinatorial network).

According to another embodiment of the invention, two distinct combinatorial networks are provided.

This implementation avoids providing a further element in a critical zone of the data-pathway (at the cost of an increased area occupation).

Another embodiment of the present invention is a memory device including the error correction device.

In one example, the memory device is a multi-level non-volatile memory device, wherein each memory cell stores a symbol.

In this way, it is possible to correct all the bits stored in every memory cell that is erroneous because of errors due to an alpha particle.

Another embodiment of the present invention provides a corresponding error correction method.

BRIEF DESCRIPTION OF THE DRAWINGS

Features and advantages of embodiments of the invention will be best understood by reference to the following detailed description, given purely by way of a non-restrictive indication, to be read in conjunction with the accompanying drawings.

DETAILED DESCRIPTION

Figure 1:
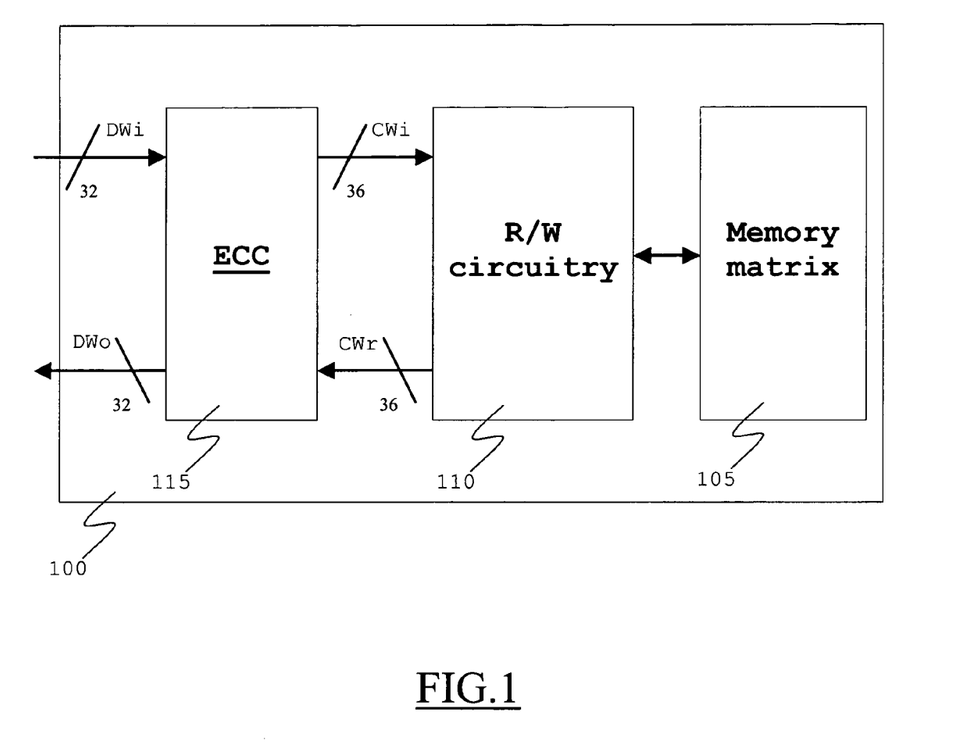
FIG. 1 is a block diagram of a memory device in which the solution according to an embodiment of the invention can be used.

Particularly, FIG. 1 is a simplified and generic functional block diagram of an embodiment of a memory device 100 (for example, a multilevel flash memory). Only a few functional blocks involved in reading and/or writing operations are shown (leaving out any other block being not relevant to the scope of the present description). Moreover, for the sake of simplicity, signals and corresponding physical lines carrying the signals are denoted with the same references. Particularly, each signal reference used in this and in the following drawings relates to a bus of lines, whose dimension is denoted in the drawings with a number associated to the corresponding reference. The aforementioned numbers denoting the dimensions of the bus lines refer (unless otherwise indicated) to the number of symbols (for example, each symbol consisting of 4 bits) that the corresponding bus lines can convey.

The memory device 100 includes a memory matrix 105, a read/write circuitry 110, and an ECC block 115.

The memory matrix 105 is formed by a plurality of memory cells (not shown in FIG. 1). Each memory cell can be programmed to multiple levels, so as to store a logic value consisting of, for example, 4 bits of information (i.e., one symbol).

The memory matrix 105 is connected to the read/write circuitry 110, which is used for selecting, reading, and writing the memory cells of the memory matrix.

The ECC block 115 receives from a device (not shown in FIG. 1) external to the memory device 100 a 32-symbol data word $DWi_{1\times 32}$, and generates a corresponding 36-symbol code word $CWi_{1\times 36}$ that is provided to the read/write circuitry 110. Moreover, the ECC block 115 receives a 36-symbol code word $CWr_{1\times 36}$ from the read/write circuitry 110 and generates a corresponding 32-symbol data word $DWo_{1\times 32}$ that is provided to the external device. The data word $DWi_{1\times 32}$ represents a word of data that is to be stored in the memory matrix 105; the ECC block 115 codifies the data word $DWi_{1\times 32}$, generating a check word $KWi_{1\times 4}$ of 4 "redundant" symbols, and adds it to the data word $DWi_{1\times 32}$, thus obtaining the code word $CWi_{1\times 36}$. Said code word $CWi_{1\times 36}$ is loaded into the memory matrix 105 by means of the read/write circuitry 110. On the other hand, the code word $CWr_{1\times 36}$ is read from the memory matrix 105 by means of the read/write circuitry 110. The code word $CWr_{1\times 36}$ is processed by the ECC block 115, which removes a check word $KWr_{1\times 4}$ of 4 redundant symbols, thereby obtaining a 32-symbol data word $DWr_{1\times 32}$; the ECC block 115 then verifies the correctness of the data word $DWr_{1\times 32}$ (possibly correcting a wrong symbol), and sends the corresponding corrected data word $DWo_{1\times 32}$ to the external device.

The codification/decodification implemented by the ECC block 115 makes use of a code that is of the Single Symbol Error Correcting (SSC) type. In order to explain this code, reference will be made to generic data words, check words and code words that are denoted omitting any index for the sake of simplicity. Single Symbol Error Correcting codes are non-binary codes defined over a finite field GF(p) (Galois Field), whose code words are constituted by symbols that can take one of p different values. For instance, GF(2) represents the well-known binary field. According to an embodiment of the present invention, a proposed code refers to 4-bit symbols, thus $p=2^4$, so that the code is defined over $GF(2^4)$. Moreover, the code is a (36,32) code. This means that each code word $CW_{1\times 36}$ consists of 36 code symbols $c_i$ (144 bits): 32 data symbols $d_j$ (128 bits) representing the data word ($DW_{1\times 32}$), plus 4 check symbols $k_l$ (16 bits) representing the check word ($KW_{1\times 4}$). This code corrects all possible errors occurring within the same 4-bit symbol, one symbol per data word; moreover, it can also detect (but not correct) errors in two symbols.

The code is defined by a parity matrix $H_{4\times 36}$ having 4 rows and 36 columns in $GF(2^4)$. Said parity matrix $H_{4\times 36}$ is composed by columns that are all non-zero vectors of symbols in $GF(2^4)$; the columns satisfy the so-called exclusion property on $GF(2^4)$, i.e., the columns are mutually linearly independent. This property guarantees that the code is of the Single Symbol Error Correcting type.

In $GF(2^4)$, a necessary and sufficient condition for a vector $CW_{1\times 36}$ of 36 symbols to be a (correct) code word is to verify the equation:

$$H_{4\times 36}CW^T_{36\times 1}=0_{4\times 1} \quad (1)$$

The parity matrix $H_{4\times 36}$ is such that its right last four columns form an identity matrix $I_{4\times 4}$:

$$H_{4\times 36}=(H'_{4\times 32}|I_{4\times 4}), \quad (2)$$

(wherein $H'_{4\times32}$ is the parity matrix $H_{4\times36}$ without the identity matrix $I_{4\times4}$).

Moreover, the code is in a systematic form, i.e., the code word $CW_{1\times36}$ is structured with "non-scrambled" data symbols $d_i$ and check symbols $k_l$ (with the check symbols $k_l$ in the positions corresponding to the identity matrix in the parity matrix):

$$CW_{1\times36} = (DW_{1\times32}|KW_{1\times4}) = (d_{31}, d_{30}, \ldots, d_1, d_0, k_3, d_2, k_1, k_0) \quad (3)$$

Thanks to the particular structure of the parity matrix $H_{4\times36}$, using the systematic form of the code means that each check symbol $k_l$ only depends on data symbols $d_i$ and does not depend on other check symbols. Consequently, the check word $KW_{1\times4}$ is a function of the data word $DW_{1\times32}$ only, with said function expressed by the matrix $H'_{4\times32}$ by the following formula:

$$Wi_{1\times4} = DWi_{1\times32} H'_{32\times4} \quad (4)$$

In other words, each check symbol $k_l$ is obtained by sums of products between data symbols $d_i$ and symbols belonging to rows of the matrix $H'_{4\times32}$ (i.e., columns of the matrix $H'^T_{32\times4}$) Therefore, the codification of the data word $DWi_{1\times32}$ in the code word $CWi_{1\times36}$ is obtained by adding (to the data word $DWi_{1\times32}$) the check word $KWi_{1\times4}$.

Let us suppose now that (instead of being equal to the correct code word $CWi_{1\times36}$) the received code word $CWr_{1\times36}$ is wrong, that is, $CWr_{1\times36} = CWi_{1\times36} + E_{1\times36}$, wherein an error is represented by a 36-symbol error word $E_{1\times36}$ (here and in the following, the symbol "+" denotes the modulo-2 sum).

More particularly, in the case of a single symbol error, said error word $E_{1\times36}$ is an all-zero-symbol vector that includes a single error symbol "e" in the same column as the wrong symbol. It is possible to obtain information on the wrong-symbol location within the code word $CWi_{1\times36}$ by means of a 4-symbol syndrome vector $S_{1\times4}$, given by:

$$S_{4\times1}^T = H_{4\times36} CWr_{36\times1}^T \quad (5)$$

In fact, the syndrome vector $S_{1\times4}$ is related to the error word $E_{1\times36}$ by the following expression:

$$S_{4\times1}^T = H_{4\times36} CWr_{36\times1}^T = H_{4\times36} CWi_{36\times1}^T + H_{4\times36} E_{36\times1}^T = H_{4\times36} E_{36\times1}^T. \quad (6)$$

According to the particular structure of the parity matrix $H_{4\times36}$, and thanks to the systematic form of the code, the calculation of the syndrome vector $S_{1\times4}$ of the received code word $CWr_{1\times36}$ can be definitely simplified:

$$S_{1\times4} = KWr_{1\times4} + KWc_{1\times4}, \quad (7)$$

where $KWr_{1\times4}$ is the check word of the received code word $CWr_{1\times36}$, and $KWc_{1\times4}$ is a recalculated check word given by:

$$KWc_{1\times4} = DWr_{1\times32} H'_{32\times4}^T. \quad (8)$$

If the syndrome vector $S_{1\times4}$ results as an all-zeros vector, i.e., the two check words $KWr_{1\times4}$ and $KWc_{1\times4}$ are equal, no single-symbol error has occurred (that is, no symbol error or more than one symbol error has occurred).

If a single-symbol error has occurred, the syndrome vector $S_{1\times4}$ is proportional to the column of the parity matrix $H_{4\times36}$ corresponding to the location of the error; for example, if an error occurs in the j-th symbol of the received code word $CWr_{1\times36}$, the syndrome vector $S_{1\times4}$ is equal to the j-th column vector of the parity matrix $H_{4\times36}$ scaled by the "e" symbol.

Once recognized that a single-symbol error has occurred in the received code word $CWr_{1\times36}$, it is possible to correct it using the corresponding syndrome vector $S_{1\times4}$. In fact, as will be more clear in the following description of the implementation of the ECC block, knowing the position of the symbol error, it is possible to generate a mask word $MW_{1\times32}$ that, added to the data word $DWr_{1\times32}$, allows obtaining the correct data word $Dwo_{1\times32}$.

Referring now more specifically to an implementation according to an embodiment of the invention, each one of the elements of the parity matrix $H_{4\times36}$ is a sub-matrix that belongs to a set of $2^4-1$ elements in $GF(2^4)$, which elements correspond to a particular $GF(2^4)$ primitive polynomial (of degree 4): $x^4+x+1$. Said set of $2^4-1$ elements includes a companion matrix $T_{4\times4}$ (generated by the primitive polynomial $x^4+x+1$) and all the powers in $GF(2^4)$ of the companion matrix $T_{4\times4}$, as can be seen in the FIG. 2 (the set of powered elements of $T_{4\times4}$ is isomorphic to $GF(2^4)$). It should be noted that the element $T^0_{4\times4}$ represents the identity matrix $I_{4\times4}$ and the element $T^\infty_{4\times4}$ represents the all-zeros matrix. It should also be noted that the inverse of the generic element $T^i_{4\times4}$ is $T^{-i}_{4\times4} = T^{15-i}_{4\times4}$, $0 \leq i \leq 14$. The parity matrix $H_{4\times36}$, represented in $GF(2^4)$, is illustrated in FIG. 3a, while the same parity matrix, represented in $GF(2)$ ($H_{16\times144}$, having 16 rows and 144 columns), is illustrated in FIG. 3b. That is, replacing the $GF(2^4)$ elements of the parity matrix $H_{4\times36}$ of FIG. 3a with their binary representation of FIG. 2, the parity matrix $H_{4\times36}$ of FIG. 3a translates into the parity matrix $H_{16\times144}$ in $GF(2)$ shown in FIG. 3b.

Referring to the FIGS. 2, 3a and 3b together, it is possible to point out some features of the parity matrix ($H_{4\times36}$ in $GF(2^4)$, or the equivalent one $H_{16\times144}$ in $GF(2)$), advantages of which are described in the following, referring to the circuital implementation of the ECC block.

The parity matrix $H_{16\times144}$ has a Maximum Row Weight, i.e., the maximum number of "1"s present on every row, that is equal to 22.

Figure 2:
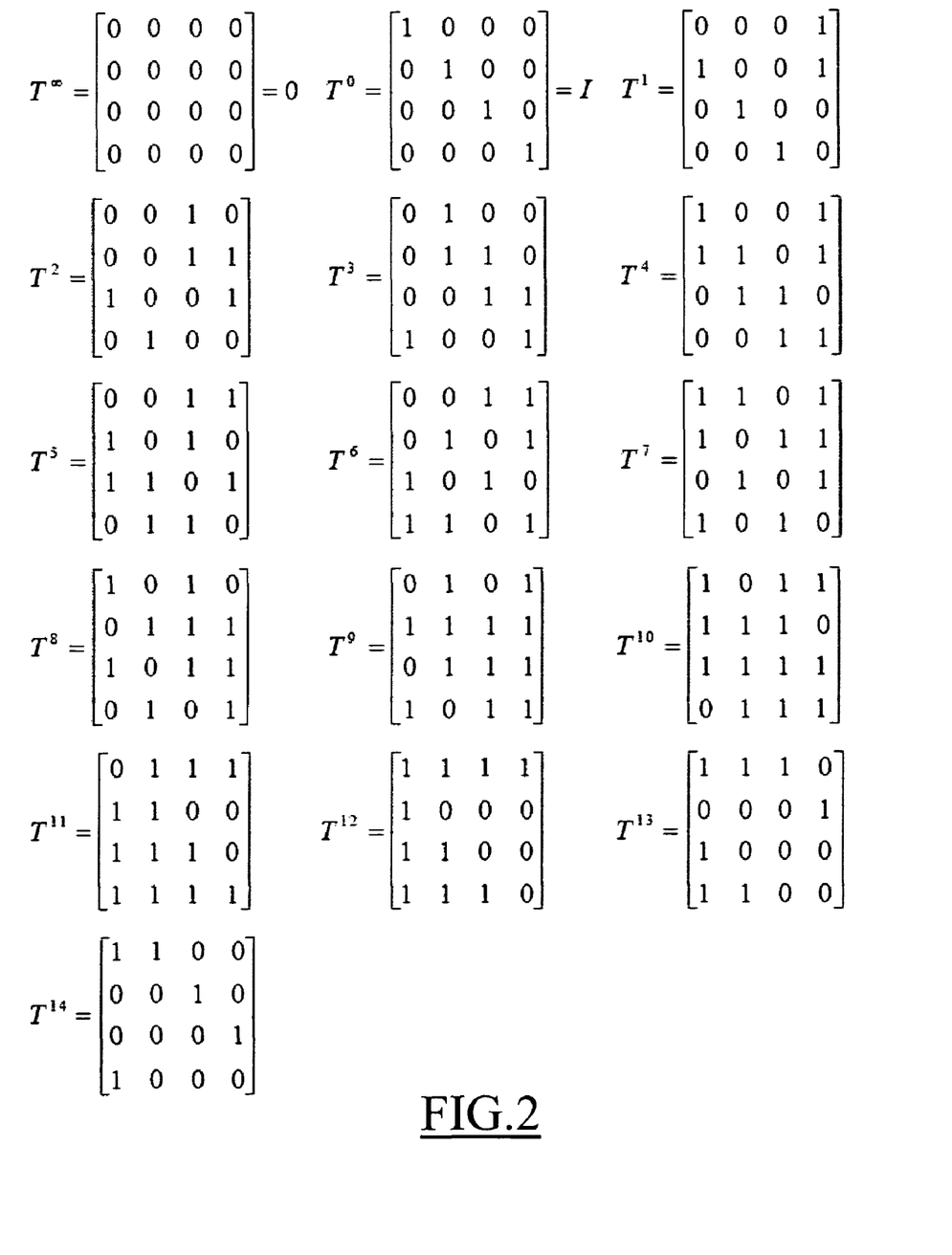
FIG. 2 illustrates a companion matrix of a primitive polynomial $x^4+x+1$ in $GF(2^4)$ with all its powers according to an embodiment of the invention.
Figure 3B:
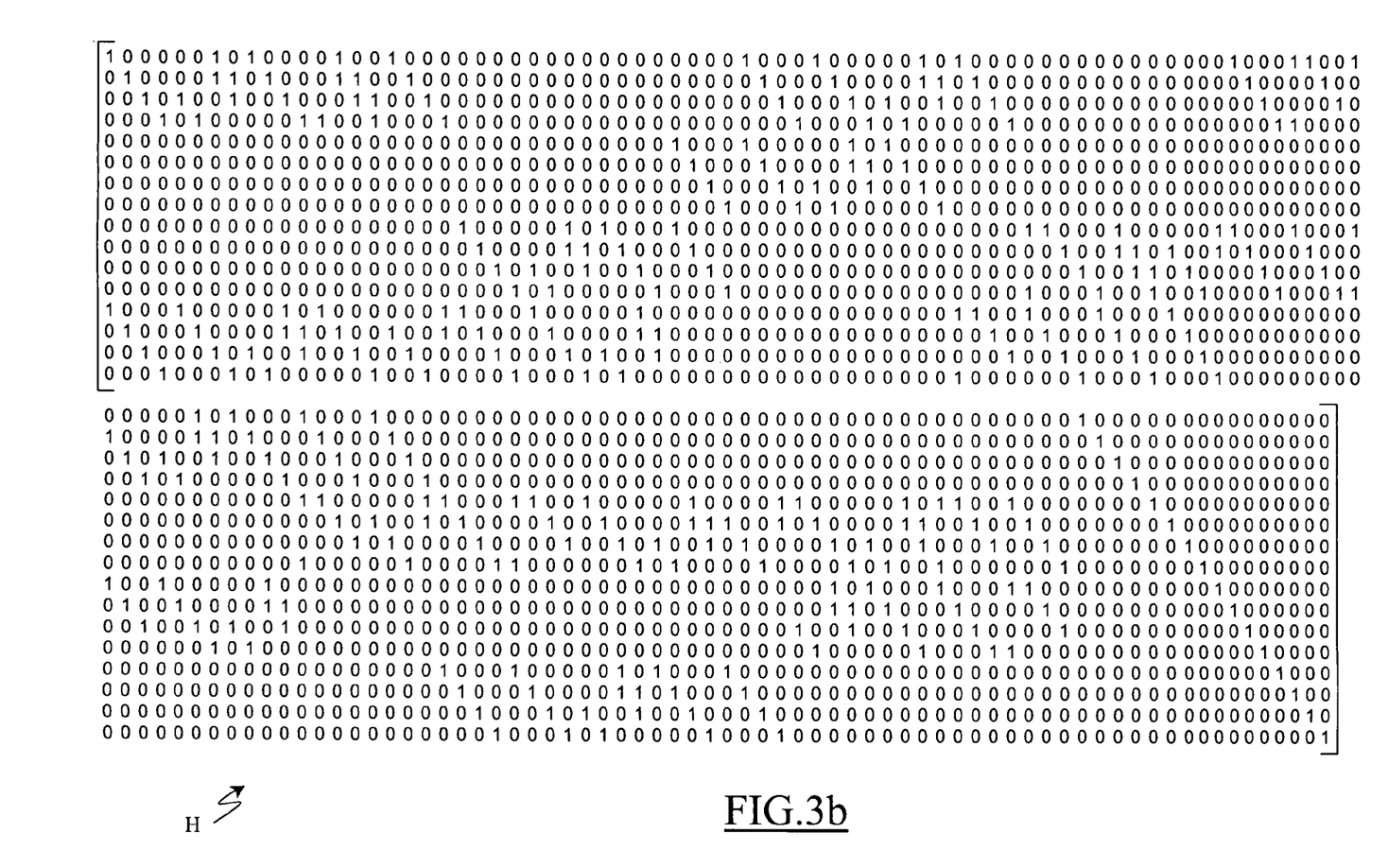
FIG. 3b illustrates the same parity matrix represented in $GF(2)$ according to an embodiment of the invention.

Moreover, in the set of all possible linearly independent columns of 4 elements belonging to the set of FIG. 2, each column of the parity matrix $H_{4\times36}$ has exactly two all-zeros matrices $0_{4\times4}$, and at least one identity matrix $I_{4\times4}$.

Finally, in each row of the parity matrix $H_{16\times144}$, the "1"s are grouped in sets with fewer than 17 bit locations between the first and the last "1".

Figure 4A:
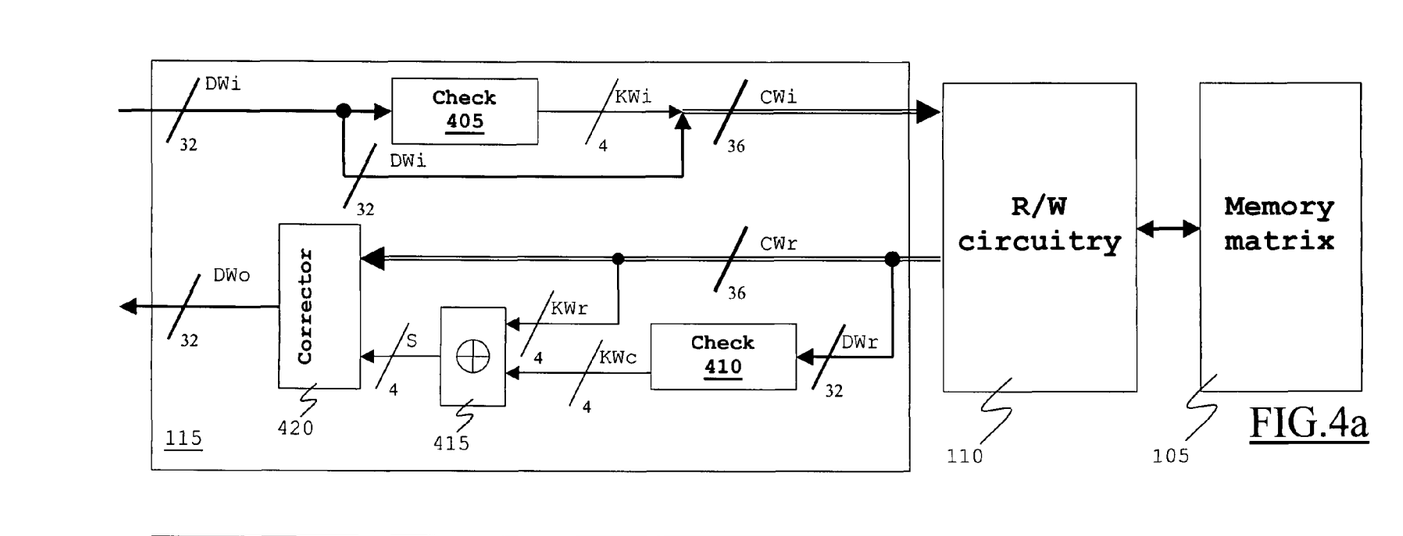
FIG. 4a is a block diagram showing the structure of an ECC block according to an embodiment of the present invention.

Referring now to FIG. 4a, a more detailed functional block diagram of the memory device 100 is shown according to an embodiment of the present invention.

During an operation in which a data word $DWi_{1\times32}$ has to be stored in the memory matrix 105, such data word $DWi_{1\times32}$ is supplied to a check block 405 of the ECC block 115, which provides the check word $KWi_{1\times4}$ in response thereto. Consequently, the check block 405 is a circuital implementation of the relation:

$$KWi_{1\times4} = DWi_{1\times32} H'_{32\times4}^T, \quad (9)$$

i.e., it represents the matrix $H'^T_{32\times4}$ in the binary form ($H'^T_{128\times16}$ in $GF(2)$). To implement such matrix $H'^T_{128\times16}$, the check block 405 includes a tree of XOR logic gates (not shown in FIG. 4a). Given that each check symbol $k_i$ of the check word $KWi_{1\times4}$ is obtained by sums of products between data symbols $d_i$ and symbols belonging to rows of the matrix $H'_{4\times32}$, and given that the results of such products are different from zero only for the "1"s in the corresponding rows, the complexity of the tree of XOR logic gates depends on such numbers of "1"s. More particularly, every "1" in each row of the matrix $H'_{128\times16}$ feeds said XOR tree, so the fact that the parity matrix $H_{16\times144}$ has a relatively low Maximum Row Weight (22) reduces the number of XOR gates (typically with a fan-in of a few units) that are required for its implementation. Therefore, this feature lowers the number of logic gate layers (i.e., the maximum number of logic gates that an input signal may cross along the pathway toward the exit of the circuit) of the XOR tree. Furthermore, the parity matrix $H_{16\times144}$ has a total number and a distribution of "1"s such that for the generation of each bit of the check word $KWi_{1\times4}$, the number of logic gate layers is balanced and kept minimum. Finally, the fact that in each row of the parity matrix $H_{16\times144}$ the "1"s are grouped in sets with less than 17 bit locations between the first and the last "1" allows minimizing the routing for feeding the inputs of the XOR gates of the tree with the highest fan-in.

The check word $KWi_{1\times4}$ generated by the check block 405 is then supplied in concert with the data word $DWi_{1\times32}$ (providing the code word $CWi_{1\times36}$) to the read/write circuitry 110, which stores such code word $CWi_{1\times36}$ into the memory matrix 105.

During a read operation, the read/write circuitry 110 provides the received code word $CWr_{1\times36}$ (stored in the memory matrix 105) to the ECC block 115. As previously described, the received code word $CWr_{1\times36}$ may be a wrong version of the stored code word $CWi_{1\times36}$, that is, $CWr_{1\times36}=CWi_{1\times36}+E_{1\times36}$. Such received code word $CWr_{1\times36}$ includes a data word $DWr_{1\times32}$ and a check word $KWr_{1\times4}$. The data word $DWr_{1\times32}$ is supplied to a check block 410, whose structure is identical to the one of the check block 405. In fact, the check block 410 provides the recalculated check word $KWc_{1\times4}$ in response to the data word $DWr_{1\times32}$, according to the following equation:

$$KWc_{1\times4}=DWr_{1\times32}H_{32\times4}'^{T}, \quad (10)$$

i.e., the check block 410 represents again the matrix $H'^{T}_{32\times4}$ in the binary form ($H'^{T}_{128\times16}$ in GF(2)).

Such recalculated check word $KWc_{1\times4}$ is modulo-2 summed with the check word $KWr_{1\times4}$ in an XOR block 415, that consequently provides the syndrome vector $S_{1\times4}$, as previously explained.

The received code word $CWr_{1\times36}$ and the syndrome vector $S_{1\times4}$ are fed to a corrector block 420, which consequently provides the data word $DWo_{1\times32}$ to the outside. In absence of any error (i.e., when the error word $E_{1\times36}$ is equal to $0_{1\times36}$), the data word $DWo_{1\times32}$ is equal to the corresponding stored data word $DWi_{1\times32}$. If a single-symbol error exists in $DWr_{1\times32}$, the corrector block 420 performs a correction operation, and the provided data word $DWo_{1\times32}$ again equals the corresponding stored data word $DWi_{1\times32}$. Finally, in presence of more than one symbol error, the corrector block 420 provides a data word $DWo_{1\times32}$ that may differ from the corresponding stored data word $DWi_{1\times32}$.

Figure 4B:
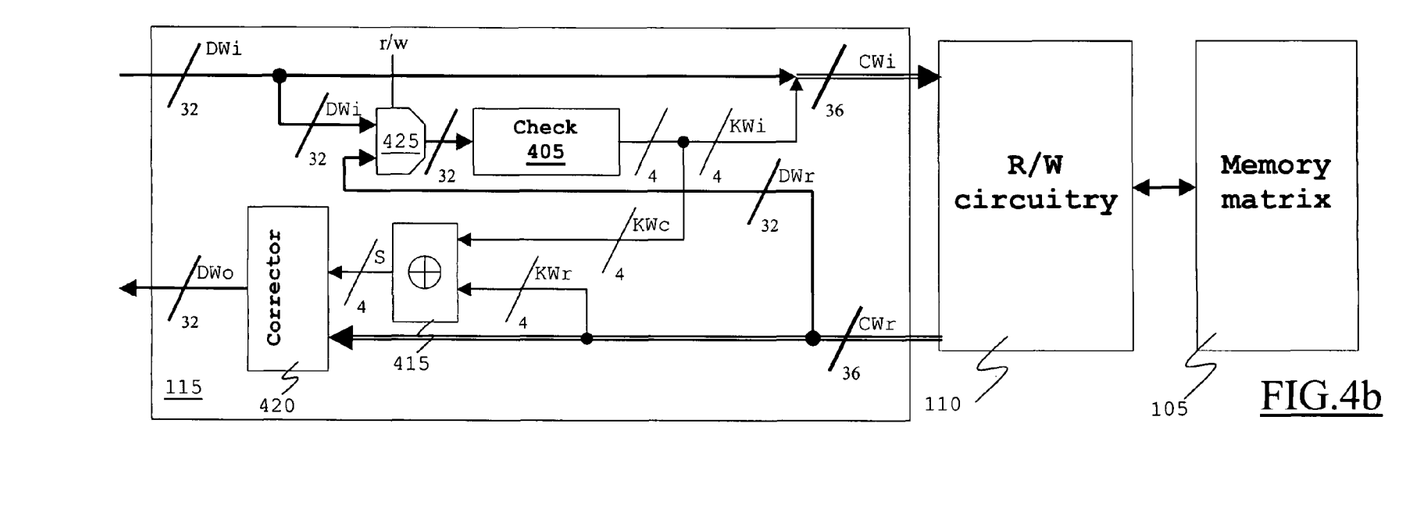
FIG. 4b is a block diagram showing the structure of the ECC block according to another embodiment of the present invention.

Referring to FIG. 4b, a detailed functional representation diagram of the ECC block 115 (FIG. 1) is shown according to another embodiment of the present invention. As seen in the description of the FIG. 4a, the processes of generating the code word $KWi_{1\times4}$ (writing operation) and the recalculated check word $KWc_{1\times4}$ (reading operation) make use of two identical blocks, that is, the check blocks 405 and 410. Consequently, the complexity of the ECC block 115 may be reduced using only one of such identical check blocks 405 and 410 (405 in FIG. 4b), with the introduction of a multiplexer block 425.

The multiplexer block 425 comprises two input terminals, that is, a first terminal for receiving the data word $DWi_{1\times32}$ and a second terminal for receiving the data word $DWr_{1\times32}$; a selection terminal receives a read/write signal r/w, and an output terminal is connected to the check block 405. During a write operation, the read/write signal r/w takes a value that controls the multiplexer block 425 to provide the data word $DWi_{1\times32}$ to the check block 405 (first terminal selected); conversely, during a read operation, the read/write signal r/w takes a value that controls the multiplexer block 425 to provide the data word $DWr_{1\times32}$ to the check block 405 (second terminal selected).

Figure 5:
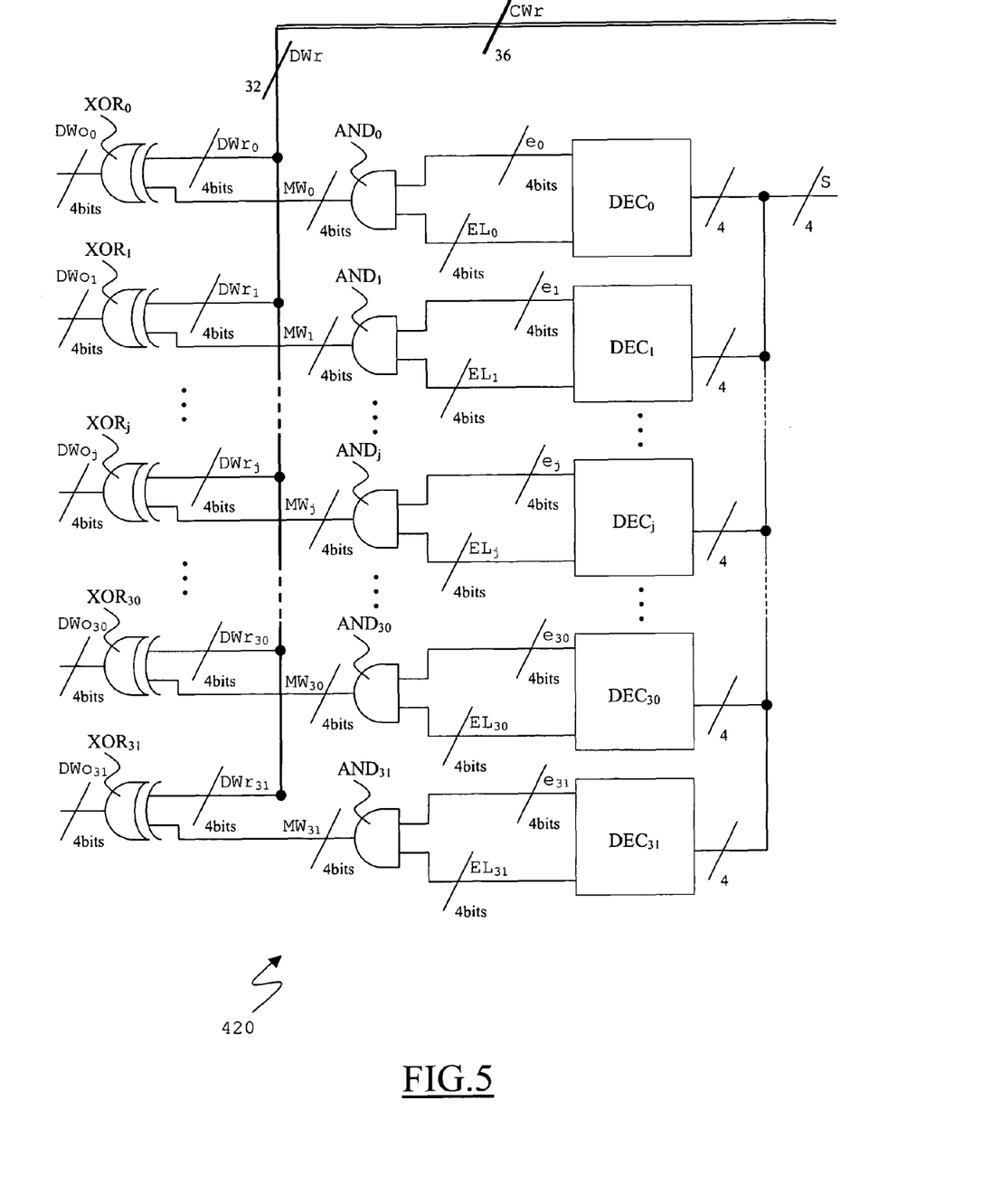
FIG. 5 illustrates the structure of a corrector block included in the ECC block according to an embodiment of the invention.

FIG. 5 is a more detailed view of an embodiment of the corrector block 420 of FIGS. 4a and 4b. The corrector block 420 receives the code word $CWr_{1\times36}$ (from the read/write circuitry) and the syndrome vector $S_{1\times4}$ (from the XOR block 415), and provides the data word $DWo_{1\times32}$ to the external device (not shown in FIG. 5).

The corrector block 420 includes a plurality of syndrome decoders $DEC_j(J=0, \ldots, 31)$, each one corresponding to a column of the matrix $H'_{4\times32}$. Every syndrome decoder $DEC_j$ receives the syndrome vector $S_{1\times4}$ and consequently provides a 4-bit error word $e_j$ (representing the possible error "e" that may occur in correspondence of the j-th symbol) and a 4-bit error location signal $EL_j$. Each one of the four pairs of bits (each pair comprising a bit of the error word $e_j$ and a corresponding bit of the error location signal $EL_j$) is fed to the input of a logic AND gate; this is represented in FIG. 5 by an $AND_j$ gate (comprising four logic AND gates) that receives the four pairs of bits from the error word $e_j$ and from the error location signal $EL_j$, and provides a 4-bit word $MW_j$, which represents the j-th symbol of the mask word $MW_{1\times32}$. Each word $MW_j$ is provided together with a corresponding 4-bit word $DWr_j$, representing the j-th symbol of the data word $DWr_{1\times32}$, to an $XOR_j$ gate. Like the $AND_j$ gate, the $XOR_j$ gate includes four logic XOR gates, each one receiving a pair of bits from the data word $DWr_j$ and from the word $MW_j$. Finally, the $XOR_j$ gate provides a 4-bit word $DWo_j$, representing the j-th symbol of the data word $DWo_{1\times32}$ to the outside.

Each syndrome decoder $DEC_j$ corresponds to a symbol of the data word $DWr_{1\times32}$, and can recognize if an error has occurred in association with its position. In other words, the operations performed by the syndrome decoder $DEC_j$ are an implementation of a simplified version of the equation (6), with reference to the j-th column of the matrix $H'_{4\times32}$. Equation (6) refers to the parity matrix $H_{4\times36}$, while the operations carried out by the syndrome decoder $DEC_j$ imply the use of the equations corresponding to the matrix $H'_{4\times32}$. For this reason, a 32-symbol error word $E_{1\times32}$ is provided, because the purpose of the corrector block 420 is to correct the data word $DWr_{1\times32}$, and not the received code word $CWr_{1\times36}$ (not necessary).

For example, if an error on the 25-th symbol of the received code word $CWr_{1\times36}$ occurs, the error word $E_{1\times36}$ is such as to have an error symbol "e" on its 25-th column. Consequently, according to equation (6), such error word $E_{1\times36}$ selects the 25-th column of the parity matrix $H_{4\times36}$ (that is, $[I\ T^2\ 0\ 0]^T$):

$$S_{4\times1}^T = H_{4\times36}E_{36\times1}^T \Rightarrow \begin{cases} s_0 = e^T \\ s_1 = T^2 e^T \\ s_2 = 0 \\ s_3 = 0 \end{cases} \Rightarrow S_1 = T^2 s_0, \quad (11)$$

wherein the syndrome vector $S_{1\times4}$ is equal to $[s_3\ s_2\ s_1\ s_0]$, with $s_3$-$s_0$ belonging to $GF(2^4)$. This means that in case of an error in the 25-th symbol the equation (11) must be verified, i.e., the four symbols $s_3, s_2, s_1, s_0$ of the syndrome vector $S_{1\times4}$ must verify the relations of the previous system. Those equations in $GF(2^4)$ can be transposed in $GF(2)$, giving that the syndrome vector $S_{1\times4}=[s_3\ s_2\ s_1\ s_0]$, with $s_3$-$s_0$ belonging to $GF(2^4)$, corresponds the syndrome vector $S_{1\times16}=[s'_{15}\ s'_{14} \ldots s'_1\ s'_0]$, with $s_{15}$-$s_0$ belonging to GF(2):

$$s_1 = T^2 s_0 \Rightarrow \begin{bmatrix} s'_7 \\ s'_6 \\ s'_5 \\ s'_4 \end{bmatrix} = \begin{bmatrix} 0 & 0 & 1 & 0 \\ 0 & 0 & 1 & 1 \\ 1 & 0 & 0 & 1 \\ 0 & 1 & 0 & 0 \end{bmatrix} \begin{bmatrix} s'_3 \\ s'_2 \\ s'_1 \\ s'_0 \end{bmatrix} \Rightarrow \begin{cases} s'_1 + s'_7 = 0 \\ s'_1 + s'_0 + s'_6 = 0 \\ s'_3 + s'_0 + s'_5 = 0 \\ s'_2 + s'_4 = 0 \end{cases} \quad (12)$$

Figure 6:
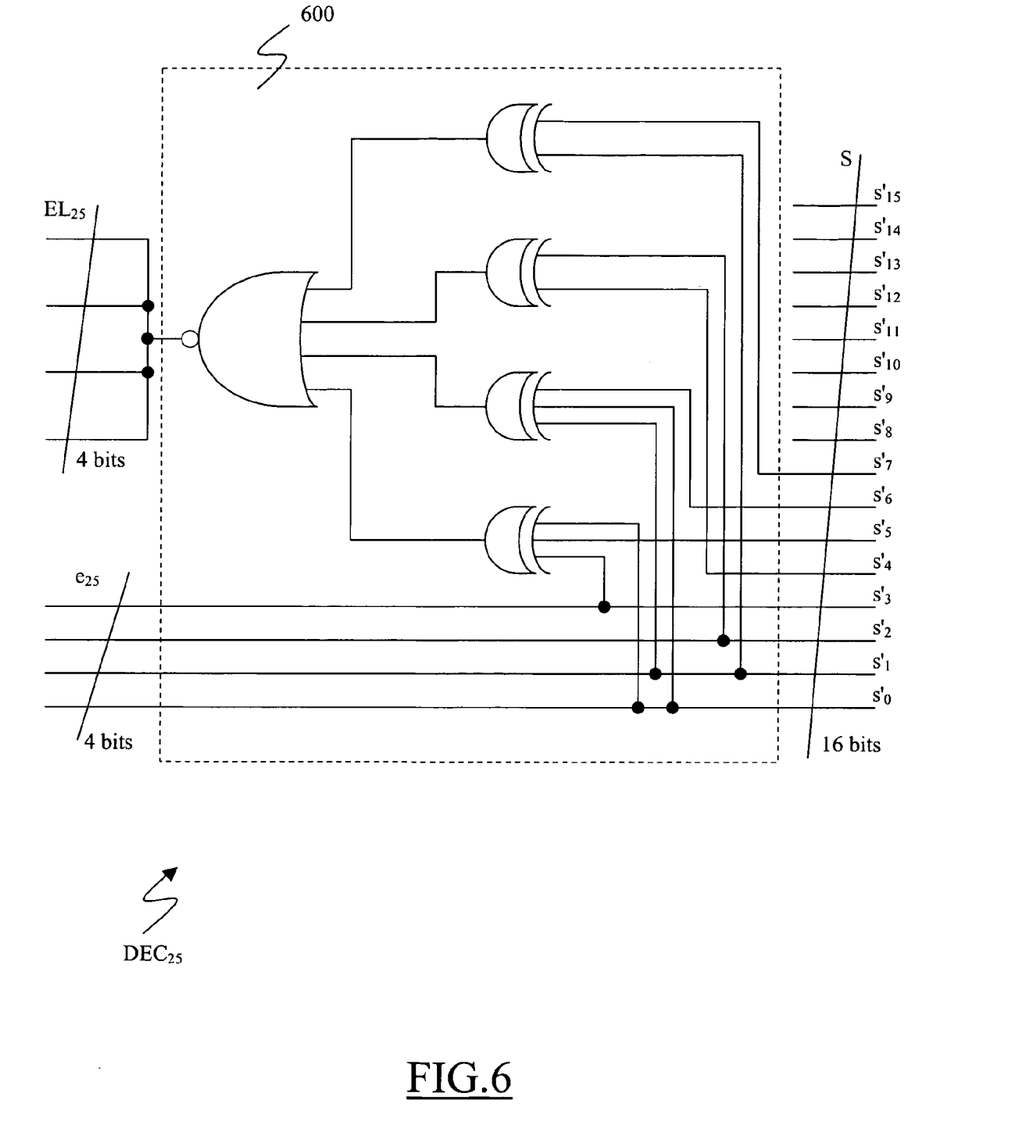
FIG. 6 illustrates an exemplary electrical schematic diagram of a circuit that computes the value of an error location signal within the ECC block according to an embodiment of the invention.

Therefore, each column of the parity matrix $H_{4 \times 36}$ corresponds to a set of four equations, that identify it. Moreover, the syndrome decoder $DEC_j$ is structured in such a way that the corresponding error location signal $EL_j$ takes a high logic value (each one of the 4 bits set to "1") if the respective system of equations is verified, and it takes a low logic value (each one of the 4 bits set to "0") otherwise. Referring to the previously described case (error on the 25-th symbol), an example of a circuit implementing the set of corresponding equations and the generation of the error location signal $EL_{25}$ is illustrated in FIG. 6. The 16 bits representing the syndrome vector $S_{1 \times 16}$ in $GF(2)$ are provided to a combinatorial network 600, that provides the 4 bits forming the error location signal $EL_{25}$ corresponding to the set of equations (12), and the 4 bits forming the error word $e_{25}$.

The proposed parity matrix $H_{4 \times 36}$ has been designed in such a way to balance the requirements of having a low Maximum Row Weight and having columns formed by elements in $GF(2^4)$ that are advantageous for its circuital implementation. In fact, the elements in $GF(2^4)$ used in the parity matrix $H_{4 \times 36}(0_{4 \times 4}, I_{4 \times 4}, T_{4 \times 4}, T^2_{4 \times 4}, T^3_{4 \times 4}, T^{14}_{4 \times 4})$ imply syndrome decoders $DEC_j$ including XOR gates having a fan-in less or equal to three.

Referring back to FIG. 5, if no symbol error occurs, the error word $E_{1 \times 36}$ and the syndrome vector $S_{1 \times 4}$ are all-zero vectors. As a consequence, all the 32 error location signals $EL_j$ take low logic values, because no system of equations is verified, and thus also the mask word $MW_{1 \times 32}$ that is fed to the 32 $XOR_j$ gates becomes an all-zero vector. This implies that the data word $DWo_{1 \times 32}$ provided to the external device by the 32 $XOR_j$ gates is equal to the data word $DWr_{1 \times 32}$ (correction not performed).

If an error "e" occurs in the symbol j-th, the word $MW_j$, representing the j-th symbol of the mask word $MW_{1 \times 32}$, is driven to take the value of the error vector $e_j$ by the corresponding syndrome decoder $DEC_j$, and is fed to the $XOR_j$ gate. In this way, the word $DWo_j$ takes a value given by the modulo-2 sum between the data word $DWr_j$ and the word $MW_j$, and thus the j-th symbol is corrected.

The parity matrix $H_{4 \times 36}$ includes at least one identity element $I_{4 \times 4}$ for each column; therefore, at least one of the four equations describing the syndrome vector $S_{1 \times 4}$ with reference to the column itself in $GF(2^4)$ is an equality with the error symbol "e" (e.g., $s_0 = e^T$ in the equations (11) for the example of the 25-th symbol). In this way, every j-th column of the parity matrix $H_{4 \times 36}$ has a syndrome decoder $DEC_j$ that regenerates the corresponding error vector $e_j$. This feature may be important, because it is possible that in response to a single-symbol error more than one error-location signal $EL_j$ might be asserted to a high logic value; however, only for the correct syndrome decoder $DEC_j$ is there the non all-zeros error vector $e_j$ in the correct position of the syndrome vector $S_{1 \times 4}$.

Naturally, in order to satisfy local and specific requirements, a person skilled in the art may apply to the solution described above many modifications and alterations. Particularly, although the present invention has been described with a certain degree of particularity with reference to embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, even though in the preceding description reference has been made to a parity matrix of 16×144 bits, the same concepts also apply if the parity matrix is a matrix of 144×16 bits, with all the data words, code words, and check words that are represented by column vectors instead by row vectors.

Similar considerations apply if the ECC block is implemented in different ways. In particular, concepts of the present invention are also applicable when the corrector block includes different logic gates carrying out the same operations.

In any case, the systematic form of the code can be achieved even if the data symbols and the check symbols have different positions in the code word (with a parity matrix that is updated accordingly).

It is also contemplated that the ECC block could be used within a memory device different than a flash-type one.

Moreover, it will be apparent to those skilled in the art that features providing advantages are not essential for carrying out the invention, and may be omitted or replaced with different features.

For example, an implementation in which the parity matrix is obtained from the one described above as a permutation of its columns in $GF(2)$, instead of in $GF(2^4)$, is not excluded.

The use of the proposed solutions in a non-systematic code is within the scope of the invention.

In any case, it is possible to implement embodiments of the invention in standard binary memories at 2 levels, or even in other memories (such as DRAMs).

Likewise, it is contemplated that the ECC block could be used in devices different than memories. For example, a first check block may be used within a transmitter device, and another check block may be used within a receiver device for detecting data errors on a transmission network.

Referring again to FIGS. 1, 4a, and 4b, the memory device 100 may be incorporated into an electronic system such as a computer system.

From the foregoing it will be appreciated that, although specific embodiments of the invention have been described herein for purposes of illustration, various modifications may be made without deviating from the spirit and scope of the invention.

The invention claimed is:
1. An error correction device including:
a generator for generating a check word of 16 bits from a data word of 128 bits according to a parity matrix of 16×144 bits, the check word being capable of providing information about a correctness of the data word, wherein the
the parity matrix comprises any permutation of the following 144 vectors of 16 bits:

-continued

-continued $$\begin{bmatrix}0\\0\\0\\0\\1\\0\\0\\1\\0\\0\\0\\0\\1\\0\\0\\0\end{bmatrix}\begin{bmatrix}0\\0\\0\\0\\1\\0\\0\\0\\0\\0\\0\\0\\0\\1\\0\\0\end{bmatrix}\begin{bmatrix}0\\0\\0\\0\\0\\1\\0\\0\\0\\0\\0\\0\\0\\0\\1\\0\end{bmatrix}\begin{bmatrix}0\\0\\0\\0\\0\\0\\1\\0\\0\\0\\0\\0\\0\\0\\0\\1\end{bmatrix}\begin{bmatrix}0\\0\\0\\0\\1\\0\\0\\0\\0\\0\\0\\0\\0\\0\\1\\0\end{bmatrix}\begin{bmatrix}0\\0\\0\\0\\0\\1\\0\\0\\0\\0\\0\\0\\1\\0\\0\\1\end{bmatrix}\begin{bmatrix}0\\0\\0\\0\\0\\0\\1\\0\\0\\0\\0\\0\\0\\1\\1\\0\end{bmatrix}\begin{bmatrix}0\\0\\0\\0\\0\\1\\0\\1\\0\\0\\0\\0\\1\\0\\0\\0\end{bmatrix}\begin{bmatrix}0\\0\\0\\0\\0\\0\\0\\0\\0\\0\\0\\0\\0\\1\\1\\0\end{bmatrix}\begin{bmatrix}0\\0\\0\\0\\0\\0\\0\\1\\0\\0\\0\\0\\0\\0\\0\\0\end{bmatrix}\begin{bmatrix}0\\0\\0\\0\\1\\1\\1\\0\\0\\0\\0\\0\\0\\0\\0\\0\end{bmatrix}\begin{bmatrix}0\\0\\0\\0\\0\\0\\0\\0\\0\\0\\0\\0\\1\\0\\0\\1\end{bmatrix}\begin{bmatrix}0\\0\\0\\0\\0\\1\\1\\0\\0\\0\\0\\0\\0\\0\\1\\0\end{bmatrix}\begin{bmatrix}0\\0\\0\\0\\0\\0\\0\\1\\0\\0\\0\\0\\0\\1\\0\\0\end{bmatrix}\begin{bmatrix}0\\0\\0\\0\\0\\0\\0\\0\\0\\0\\0\\0\\0\\0\\0\\0\end{bmatrix}\begin{bmatrix}0\\0\\0\\0\\1\\1\\0\\0\\0\\0\\0\\0\\0\\0\\0\\1\end{bmatrix}$$

$$\begin{bmatrix}0\\0\\0\\0\\1\\0\\0\\0\\0\\0\\0\\1\\0\\0\\0\\0\end{bmatrix}\cdots$$

$$\begin{bmatrix}1\\0\\0\\0\\0\\0\\0\\0\\0\\0\\0\\0\\0\\0\\0\\0\end{bmatrix}\begin{bmatrix}0\\1\\0\\0\\0\\0\\0\\0\\0\\0\\0\\0\\0\\0\\0\\0\end{bmatrix}\begin{bmatrix}0\\0\\1\\0\\0\\0\\0\\0\\0\\0\\0\\0\\0\\0\\0\\0\end{bmatrix}\begin{bmatrix}0\\0\\0\\1\\0\\0\\0\\0\\0\\0\\0\\0\\0\\0\\0\\0\end{bmatrix}\begin{bmatrix}0\\0\\0\\0\\1\\0\\0\\0\\0\\0\\0\\0\\0\\0\\0\\0\end{bmatrix}\begin{bmatrix}0\\0\\0\\0\\0\\1\\0\\0\\0\\0\\0\\0\\0\\0\\0\\0\end{bmatrix}\begin{bmatrix}0\\0\\0\\0\\0\\0\\1\\0\\0\\0\\0\\0\\0\\0\\0\\0\end{bmatrix}\begin{bmatrix}0\\0\\0\\0\\0\\0\\0\\1\\0\\0\\0\\0\\0\\0\\0\\0\end{bmatrix}\begin{bmatrix}0\\0\\0\\0\\0\\0\\0\\0\\1\\0\\0\\0\\0\\0\\0\\0\end{bmatrix}\begin{bmatrix}0\\0\\0\\0\\0\\0\\0\\0\\0\\1\\0\\0\\0\\0\\0\\0\end{bmatrix}\begin{bmatrix}0\\0\\0\\0\\0\\0\\0\\0\\0\\0\\1\\0\\0\\0\\0\\0\end{bmatrix}\begin{bmatrix}0\\0\\0\\0\\0\\0\\0\\0\\0\\0\\0\\1\\0\\0\\0\\0\end{bmatrix}\begin{bmatrix}0\\0\\0\\0\\0\\0\\0\\0\\0\\0\\0\\0\\1\\0\\0\\0\end{bmatrix}\begin{bmatrix}0\\0\\0\\0\\0\\0\\0\\0\\0\\0\\0\\0\\0\\1\\0\\0\end{bmatrix}\begin{bmatrix}0\\0\\0\\0\\0\\0\\0\\0\\0\\0\\0\\0\\0\\0\\1\\0\end{bmatrix}\begin{bmatrix}0\\0\\0\\0\\0\\0\\0\\0\\0\\0\\0\\0\\0\\0\\0\\1\end{bmatrix}$$

2. The error correction device of claim 1, further including:

means for generating a code word of 144 bits including the 128 bits of the data word and the 16 bits of the check word;

means for extracting a further data word of 128 bits and a further check word of 16 bits from a further code word of 144 bits;

means for generating a still further check word of 16 bits from the further data word according to the parity matrix; and means for correcting the further data word according to a comparison between the further check word and the still further check word.

3. The error correction device of claim 1, wherein:

each data word comprises 32 symbols in $GF(2^4)$, each symbol comprising 4 bits;

each check word comprises 4 symbols;

each code word comprises 36 symbols including the 32 symbols of the corresponding data word and the 4 symbols of the corresponding check word; and the parity matrix comprises 4×36 symbols including any permutation of the following 36 vectors of 4 symbols:

$$\begin{bmatrix}I\\0\\0\\I\end{bmatrix}\begin{bmatrix}T^2\\0\\0\\I\end{bmatrix}\begin{bmatrix}I\\0\\0\\T^2\end{bmatrix}\begin{bmatrix}T^3\\0\\0\\I\end{bmatrix}\begin{bmatrix}I\\0\\0\\T\end{bmatrix}\begin{bmatrix}0\\0\\I\\I\end{bmatrix}\begin{bmatrix}0\\0\\T^2\\I\end{bmatrix}\begin{bmatrix}0\\0\\I\\T^2\end{bmatrix}\begin{bmatrix}0\\I\\I\\0\end{bmatrix}\begin{bmatrix}I\\I\\I\\0\end{bmatrix}\begin{bmatrix}I\\T^2\\0\\0\end{bmatrix}\begin{bmatrix}T^2\\I\\0\\0\end{bmatrix}$$

$$\begin{bmatrix}I\\0\\0\\T^{14}\end{bmatrix}\begin{bmatrix}0\\0\\T^{14}\\I\end{bmatrix}\begin{bmatrix}0\\0\\T^3\\I\end{bmatrix}\begin{bmatrix}0\\0\\T\\I\end{bmatrix}\begin{bmatrix}I\\0\\I\\0\end{bmatrix}\begin{bmatrix}T^{14}\\0\\I\\0\end{bmatrix}\begin{bmatrix}I\\0\\T^{14}\\0\end{bmatrix}\begin{bmatrix}T^2\\0\\I\\0\end{bmatrix}\begin{bmatrix}I\\0\\T^2\\0\end{bmatrix}\begin{bmatrix}I\\T^{14}\\0\\0\end{bmatrix}\begin{bmatrix}I\\T\\0\\0\end{bmatrix}\begin{bmatrix}0\\I\\0\\I\end{bmatrix}$$

$$\begin{bmatrix}0\\T^{14}\\0\\I\end{bmatrix}\begin{bmatrix}0\\I\\0\\T^2\end{bmatrix}\begin{bmatrix}0\\T^2\\0\\I\end{bmatrix}\begin{bmatrix}0\\T\\0\\I\end{bmatrix}\begin{bmatrix}0\\I\\T^2\\0\end{bmatrix}\begin{bmatrix}0\\T^2\\I\\0\end{bmatrix}\begin{bmatrix}0\\T^{14}\\I\\0\end{bmatrix}\begin{bmatrix}0\\I\\T^{14}\\0\end{bmatrix}\begin{bmatrix}I\\0\\0\\0\end{bmatrix}\begin{bmatrix}0\\I\\0\\0\end{bmatrix}\begin{bmatrix}0\\0\\I\\0\end{bmatrix}\begin{bmatrix}0\\0\\0\\I\end{bmatrix}$$

wherein "T" is a companion matrix of 4×4 bits corresponding to a primitive polynomial $1+x+x^4$ in $GF(2^4)$, "0" is an all-zeros matrix of 4×4 bits, and "I" is an identity matrix of 4×4 bits.

4. The error correction device of claim 3, wherein each code word has the symbols of the included check word in positions within the code word corresponding to the vectors of the parity matrix, composed by three all-zeros matrices and one identity matrix.

5. The error correction device of claim 4, wherein the parity matrix comprises:

$$H = \begin{bmatrix} I & T^2 & I & T^3 & I & 0 & 0 & 0 & 0 & I & I & T^2 & I & 0 & 0 & 0 & I & T^{14} \\ 0 & 0 & 0 & 0 & 0 & 0 & 0 & 0 & I & I & T^2 & I & 0 & 0 & 0 & 0 & 0 & 0 \\ 0 & 0 & 0 & 0 & 0 & I & T^2 & I & I & 0 & 0 & 0 & 0 & T^{14} & T^3 & T & I & I \\ I & I & T^2 & I & T & I & I & T^2 & 0 & 0 & 0 & 0 & T^{14} & I & I & I & 0 & 0 \end{bmatrix}$$

$$\begin{bmatrix} I & T^2 & I & I & I & 0 & 0 & 0 & 0 & 0 & 0 & 0 & 0 & 0 & I & 0 & 0 & 0 \\ 0 & 0 & 0 & T^{14} & T & I & T^{14} & I & T^2 & T & I & T^2 & T^{14} & I & 0 & I & 0 & 0 \\ T^{14} & I & T^2 & 0 & 0 & 0 & 0 & 0 & 0 & T^2 & I & I & T^{14} & 0 & 0 & I & 0 \\ 0 & 0 & 0 & 0 & 0 & I & I & T^2 & I & I & 0 & 0 & 0 & 0 & 0 & 0 & 0 & I \end{bmatrix}$$

as the parity matrix.

6. The error correction device of claim 2, wherein the means for generating the check word and the means for generating the still further check word include a single combinatorial network and means for selectively providing the data word or the further data word to the combinatorial network.

7. The error correction device of claim 2, wherein the means for generating the check word includes a first combinatorial network and the means for generating the still further check word includes a second combinatorial network distinct from the first combinatorial network.

8. A memory device including:
a memory matrix of memory cells;
the error correction device of claim 2 for receiving the data word from outside the memory device and for providing the further data word outside the memory device; and
a read/write circuitry including means for receiving the code word from the error correction device and storing said code word onto the memory matrix and means for reading the further code word from the memory matrix and providing said further code word to the error correction device.

9. The memory device of claim 8, wherein the memory device is a multi-level non-volatile memory device, each memory cell storing a symbol.

10. An error correction method including the step of:
generating a check word of 16 bits from a data word of 128 bits according to a parity matrix of 16×144 bits, the check word being capable of providing information about a correctness of the data word, wherein
the parity matrix has the structure defined in claim 1.

11. A method, comprising:
generating a first check value having at least sixteen bits from an input data value having at least one hundred twenty eight bits and a parity matrix having at least sixteen groups of at least one hundred twenty eight bits, no more than twenty two bits in each group having a predetermined logic level, the input data value composing a code value that also includes a second check value having at least sixteen bits;
generating a syndrome from the first and second check values;
generating an error-correcting mask from the syndrome; and
generating an output data value from the input data value and the error-correcting mask; and
storing the output data value in a memory.

12. The method of claim 11 wherein the groups comprise rows.

13. The method of claim 11 wherein the groups comprise columns.

14. The method of claim 11 wherein the sixteen groups of the parity matrix comprise any order of the following sixteen groups:

10000010100001001000000000000000000010001000001010000000000000000100011001

01000011010001100100000000000000000010001000011010000000000000000010000100

00101001001000110010000000000000000010001010010010000000000000000001000010

00010100000110010001000000000000000010001010000010000000000000000000110000

00000000000000000000000000000000000010001000001010000000000000000000000000

00000000000000000000000000000000000010001000011010000000000000000000000000

00000000000000000000000000000000000010001010010010000000000000000000000000

00000000000000000000000000000000000010001010000010000000000000000000000000

00000000000000000000010000010100010000000000000000000011000100000110001000

00000000000000000000010000110100010000000000000000000010011010010100010000

00000000000000000000010100100100010000000000000000000010011010000100001000

00000000000000000000010100001000100000000000000000000010001001001000010001

10001000001010000001100010000010000000000000000000011001000100010000000000

-continued

```
01000100001101001001010001000011000000000000000000100100010001000000000
00100010100100100100001000101001000000000000000000100100010001000000000
00010001010000010010000100010100000000000000000001000001000100010000000000
```

```
0000010100010001000000000000000000000000000000000000000
1000011010001000100000000000000000000000000000000000000
0101001001001001000000000000000000000000000000000000000
0010100000100010001000000000000000000000000000000000000
00000000000011000001100011001000001000011000001011001000
00000000000001010010100001001000011100101000011001001000
00000000000000101000010000100101001010000101001000010010
00000000000100000100001100000010100001000010100100000001
10010000010000000000000000000000000000010100010001100
01001000011000000000000000000000000000011010001000010
00100101001000000000000000000000000000100100100000100001
00000010100000000000000000000000000000010000010000110000
00000000000000000001000100000101000100000000000000000
00000000000000000001000100001101000100000000000000000
00000000000000000001000101001001000100000000000000000
00000000000000000000010001010000010001000000000000000000
``` as the parity matrix.

15. The method of claim 11 wherein the predetermined logic level comprises a logic one.

16. The method of claim 11 wherein generating the syndrome comprises generating the syndrome equal to a sum of the first and second check values.

17. The method of claim 11 wherein generating the error-correcting mask comprises:
generating from the syndrome for each section of the input data value a respective error-correcting value;
determining whether an error has occurred in one of the sections of the input data value;
if an error has occurred in one of the sections of the input data value, then generating a corresponding section of the error-correcting mask equal to the corresponding error-correcting value, and generating remaining sections of the error-correcting mask equal to zero; and
if no error has occurred in any section of the input data value, then generating all sections of the error-correcting mask equal to zero.

18. The method of claim 11 wherein generating the output data value comprises generating the output data value equal to a sum of the input data value and the error-correcting mask.

19. The method of claim 11 wherein generating the first check value comprises generating the first check value equal to a product of the input data value and the parity matrix.

20. A method, comprising:
generating a check value having at least sixteen bits from a data value having at least one hundred twenty eight bits and a parity matrix having at least sixteen groups of at least one hundred twenty eight bits, no more than twenty two bits in each group having a predetermined logic level; and
combining the check value and the data value into a code value; and
storing the code value in a memory.

21. The method of claim 20 wherein the groups comprise rows.

22. The method of claim 20 wherein the groups comprise columns.

23. The method of claim 20 wherein the sixteen groups of the parity matrix comprise any ordering of the following sixteen groups:

```
10000010100001001000000000000000000100010000101000000000000000100011001
01000011010001100100000000000000000010001000011010000000000000000010000100
00101001001000110010000000000000000010001010010010000000000000000001000010
00010100000110010001000000000000000001000101000001000000000000000000110000
00000000000000000000000000000000001000100000101000000000000000000000000000
```

-continued

```
0000000000000000000000000000000000010001000011010000000000000000000000000
0000000000000000000000000000000000001000101001001000000000000000000000000
0000000000000000000000000000000000000010001010000010000000000000000000000
0000000000000000000010000010100010000000000000000001100010000011000100010001
0000000000000000000001000011010001000000000000000000001001101001010001000
0000000000000000000000101001001001000000000000000000000100110100001000100
0000000000000000000000001010000010001000000000000000000001000100100100001000100011
1000100000101000000110001000001000000000000000001100100010001000000000000
0100010000110100100101000100001100000000000000000001001000100010000000000
0010001010010010010000100010100100000000000000000001001000100010000000000
0001000101000001001000010001010000000000000000000001000001000100010000000000
```

```
0000010100010001000000000000000000000000000000000000
1000011010001000100000000000000000000000000000000000
0101001001000100010000000000000000000000000000000000
0010100000100010001000000000000000000000000000000000
00000000000001100000110001100100000100001100000100001101100100110010001000
000000000000010100101000010010000111001010000110001000001100100100
00000000000000101000010000100101001010000101000100010010
000000000000100000100001100000010100001000010100010000001
10010000010000000000000000000000000000101001000100001100
010010000110000000000000000000000000000011010001000010
00100101001000000000000000000000000000001001001000100001
0000001010000000000000000000000000000000001000001100011000
00000000000000000010001000001010001000000000000000000
00000000000000000010001000011010001000000000000000000
00000000000000000001000101001001000100000000000000000
00000000000000000000010001010000010001000000000000000
``` as the parity matrix.

24. The method of claim 20 wherein generating the check value comprises generating the check value equal to a product of the data value and the parity matrix.

25. An error-correcting circuit, comprising:
a check-value generator operable to generate a first check value having at least sixteen bits from an input data value having at least one hundred twenty eight bits and a parity matrix having at least sixteen groups of at least one hundred twenty eight bits, no more than twenty two bits in each group having a predetermined logic level, the input data value composing a code value that also includes a second check value having at least sixteen bits;
a syndrome generator operable to generate a syndrome from the first and second check values;
an error-correcting-mask generator operable to generate an error-correcting mask from the syndrome; and
a data generator operable to generate an output data value from the input data value and the error-correcting mask.

26. A check-value circuit, comprising:
an input node operable to receive a data value having at least one hundred twenty eight bits; and
a check-value generator coupled to the input node and operable to generate a check value having at least sixteen bits from the data value and a parity matrix having at least sixteen groups of at least one hundred twenty eight bits, no more than twenty two bits in each group having a predetermined logic level.

27. A memory, comprising:
a memory matrix operable to store a code value that includes a data value having at least one hundred twenty eight bits and a first check value having at least sixteen bits;
a check-value generator operable to generate a second check value having at least sixteen bits from the data value and a parity matrix having at least sixteen groups of at least one hundred twenty eight bits, no more than twenty two bits in each group having a predetermined logic level;
a syndrome generator operable to generate a syndrome from the first and second check values;
an error-correcting-mask generator operable to generate an error-correcting mask from the syndrome; and
a data generator operable to generate an output data value from the stored data value and the error-correcting mask.

28. A memory, comprising:
a check-value generator operable to generate a check value having at least sixteen bits from a data value having at least one hundred twenty eight bits and a parity matrix having at least sixteen groups of at least one hundred twenty eight bits, no more than twenty two bits in each group having a predetermined logic level; and
a memory matrix coupled to the check-value generator and operable to store a code value that includes the check value and the data value.

29. An electronic system, comprising:
a memory, comprising,
  a memory matrix operable to store a code value that includes a data value having at least one hundred twenty eight bits and a first check value having at least sixteen bits,
  a check-value generator operable to generate a second check value having at least sixteen bits from the data value and a parity matrix having at least sixteen groups of at least one hundred twenty eight bits, no more than twenty two bits in each group having a predetermined logic level,
  a syndrome generator operable to generate a syndrome from the first and second check values,
  an error-correcting-mask generator operable to generate an error-correcting mask from the syndrome, and
  a data generator operable to generate an output data value from the stored data value and the error-correcting mask.

30. An electronic system, comprising:
a memory, comprising,
  a check-value generator operable to generate a check value having at least sixteen bits from a data value having at least one hundred twenty eight bits and a parity matrix having at least sixteen groups of at least one hundred twenty eight bits, no more than twenty two bits in each group having a predetermined logic level, and
a memory matrix coupled to the check-value generator and operable to store a code value that includes the check value and the data value.

* * * * *